United States Patent
Takeuchi et al.

(10) Patent No.: US 8,658,246 B2
(45) Date of Patent: Feb. 25, 2014

(54) MANUFACTURING METHOD OF GROUP OF WHISKERS

(75) Inventors: Toshihiko Takeuchi, Kanagawa (JP); Makoto Ishikawa, Kanagawa (JP); Yuki Murakami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 104 days.

(21) Appl. No.: 13/248,675

(22) Filed: Sep. 29, 2011

(65) Prior Publication Data

US 2012/0094420 A1 Apr. 19, 2012

(30) Foreign Application Priority Data

Oct. 15, 2010 (JP) ................... 2010-232927

(51) Int. Cl.
*C23C 16/00* (2006.01)
*H01L 31/18* (2006.01)

(52) U.S. Cl.
USPC ............... 427/255.18; 427/248.1; 117/75; 977/814

(58) Field of Classification Search
None
See application file for complete search history.

(56) References Cited

U.S. PATENT DOCUMENTS

| | | | |
|---|---|---|---|
| 5,843,225 | A | 12/1998 | Takayama et al. |
| 2002/0084502 | A1* | 7/2002 | Jang et al. ............ 257/432 |
| 2005/0026317 | A1* | 2/2005 | Sirringhaus et al. ......... 438/21 |
| 2005/0133476 | A1* | 6/2005 | Islam et al. ............ 216/2 |
| 2006/0097389 | A1* | 5/2006 | Islam et al. ............ 257/734 |
| 2006/0255452 | A1* | 11/2006 | Wang et al. ............ 257/714 |
| 2008/0079104 | A1* | 4/2008 | Stewart et al. ............ 257/433 |
| 2010/0044072 | A1* | 2/2010 | Wang et al. ............ 174/126.1 |
| 2010/0206367 | A1 | 8/2010 | Jeong et al. |
| 2011/0089402 | A1* | 4/2011 | Qi ............ 257/21 |
| 2011/0151290 | A1 | 6/2011 | Cui et al. |

FOREIGN PATENT DOCUMENTS

| | | |
|---|---|---|
| JP | 2001-210315 | 8/2001 |
| JP | 2002-083594 | 3/2002 |
| JP | 2003-246700 | 9/2003 |
| JP | 2004-281317 | 10/2004 |
| JP | 2010-192870 | 9/2010 |
| JP | 2010-210579 | 9/2010 |

OTHER PUBLICATIONS

Cui.L et al., "Crystalline-Amorphous Core-Shell Silicon Nanowires for High Capacity and High Current Battery Electrodes", Nano Letters, 2009, vol. 9, No. 1, pp. 491-495.
Kamins et al. "Ti-catalyzed Si nanowires by chemical vapor deposition: Microscopy and growth mechanisms", Journal of Applied Physics, vol. 89, No. 2, pp. 1008-1016, Jan. 15, 2001.
Kohno et al. "Silicon Nanoneedles Grown by a Simple Thermal Treatment Using Metal-Sulfur Catalysts" Jpn. J. Appl. Phys., vol. 41, (2002), pp. 577-578.

* cited by examiner

*Primary Examiner* — Joseph Miller, Jr.
(74) *Attorney, Agent, or Firm* — Nixon Peabody LLP; Jeffrey L. Costellia

(57) ABSTRACT

A seed substrate is placed to face a formation substrate, and then a gas containing silicon is introduced and chemical vapor deposition is performed. There is no particular limitation on a kind of a material used for the formation substrate as long as the material can withstand the temperature at which the reduced pressure chemical vapor deposition is performed. A group of silicon whiskers which does not include a seed atom can be grown directly on and in contact with the formation substrate. Further, the substrate provided with the group of whiskers can be applied to a solar cell, a lithium ion secondary battery, and the like, by utilizing surface characteristics of the group of whiskers.

30 Claims, 7 Drawing Sheets

FIG. 4A
FIG. 4B
FIG. 4C
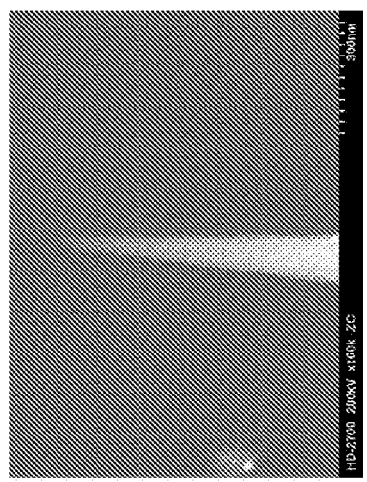
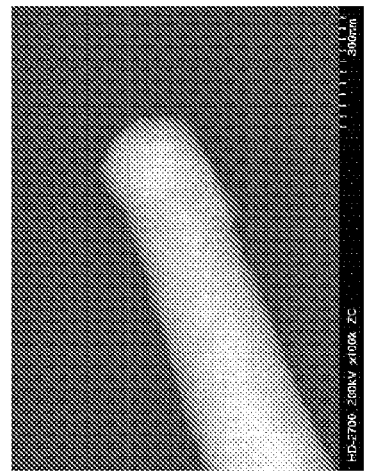

US 8,658,246 B2

MANUFACTURING METHOD OF GROUP OF WHISKERS

BACKGROUND OF THE INVENTION

1. Field of the Invention

The present invention relates to a manufacturing method of a group of whiskers.

2. Description of the Related Art

In recent years, solar photovoltaic power generation has attracted attention in the new energy field. The solar photovoltaic power generation is a method of converting energy of sunlight into electrical energy, and solar photovoltaic power is one of renewable energies. The advantages of the solar photovoltaic power generation are that there is no worry about depletion of a raw material and that greenhouse effect gases are not generated while power generation. As for solar photovoltaic power generation, a solar cell for which single crystal silicon, polycrystalline silicon, amorphous silicon, or the like is used has been put to practical use and widely used. Nowadays, in order to improve solar cell characteristics, a technique for improving the conversion efficiency has been developed. Patent Document 1 discloses a manufacturing method of a solar cell which includes a silicon nanowire and is designed to prevent reflection of sunlight and achieve a conversion efficiency of 35% that is upper limit of crystalline silicon-based solar cell.

Patent Document 2 discloses a technique in that a large number of minute needle-like silicon crystals are grown on one surface side of a substrate, which are applied to a photoelectric conversion device such as a solar cell or a power storage device such as a secondary battery with ion mobility.

REFERENCE

Patent Document

[Patent Document 1] Japanese Published Patent Application No. 2010-192870

[Patent Document 2] Japanese Published Patent Application No. 2010-210579

SUMMARY OF THE INVENTION

When a group of whiskers is grown on a substrate, a seed atom layer formed on the substrate has a function of promoting the growth of the group of whiskers. A nucleus (a seed atom) is generated and at the same time, a group of whiskers starts to grow from the nucleus so as to follow the nucleus. In other words, the group of whiskers is grown on the substrate provided with the seed atom layer; thus, the nucleus generally exists on an end of the group of whiskers, and it is extremely difficult to grow a group of whiskers that does not include a nucleus. There is another problem in that growth of a group of whiskers directly on a substrate provided with no seed atom layer is impossible in principle.

In view of the above problems, an object of one embodiment of the disclosed invention is to provide a manufacturing method of a group of whiskers in which a group of whiskers that does not include a nucleus (seed atom) can be grown directly on a substrate provided with no seed atom layer.

One embodiment of the present invention is a manufacturing method of a group of whiskers, including the steps of: placing a first substrate and an insulating substrate so that a surface with a seed atom layer of the first substrate is substantially parallel to one surface of the insulating substrate, and introducing a gas containing silicon and performing chemical vapor deposition so as to grow a group of whiskers.

One embodiment of the present invention is a manufacturing method of a group of whiskers, including the steps of: placing a substrate constituted by a seed atom and an insulating substrate so that one surface of the substrate constituted by the seed atom is substantially parallel to one surface of the insulating substrate, and introducing a gas containing silicon and performing chemical vapor deposition so as to grow a group of whiskers.

One embodiment of the present invention is a manufacturing method of a group of whiskers, including the steps of: placing a first substrate, an insulating substrate, and a second substrate so that a surface with a first seed atom layer of the first substrate is substantially parallel to one surface of the insulating substrate, and a surface with a second seed atom layer of the second substrate is parallel to the other surface of the insulating substrate, and introducing a gas containing silicon and performing chemical vapor deposition so as to grow a group of whiskers.

One embodiment of the present invention is a manufacturing method of a group of whiskers, including the steps of: placing a substrate constituted by a first seed atom, an insulating substrate, and a substrate constituted by a second seed atom so that a surface of the substrate constituted by the first seed atom is substantially parallel to one surface of the insulating substrate, and a surface of the substrate constituted by the second seed atom is parallel to the other surface of the insulating substrate, and introducing a gas containing silicon and performing chemical vapor deposition so as to grow a group of whiskers.

In one embodiment of the present invention, a reduced pressure chemical vapor deposition device is used for the step of introducing a gas containing silicon and performing chemical vapor deposition so as to grow a group of whiskers.

In one embodiment of the present invention, the step of introducing a gas containing silicon and performing chemical vapor deposition is performed under conditions that temperature is greater than or equal to 600° C. and less than or equal to 700° C.; pressure is greater than or equal to 20 Pa and less than or equal to 200 Pa; a flow rate of a $SiH_4$ gas is greater than or equal to 300 sccm and less than or equal to 3000 sccm, a flow rate of an $N_2$ gas is greater than or equal to 0 sccm and less than or equal to 1000 sccm (the flow rate of the $SiH_4$ gas is greater than the flow rate of the $N_2$ gas); a period of time is greater than or equal to 120 minutes and less than or equal to 180 minutes, and growth of whiskers continuously proceeds utilizing the reduced pressure chemical vapor deposition device.

In one embodiment of the present invention, a distance between the substrates is greater than or equal to 1.0 cm and less than or equal to 3.0 cm.

In one embodiment of the present invention, a thickness of the seed atom layer is greater than or equal to 10 nm and less than or equal to 1000 nm.

In one embodiment of the present invention, a single whisker of the group of whiskers has a width of 50 nm to 300 nm, a diameter of 100 nm to 400 nm, and a length of 700 nm to 800 nm.

In one embodiment of the present invention, the first substrate and the second substrate are each any one of an aluminosilicate glass substrate, a barium borosilicate glass substrate, an aluminoborosilicate glass substrate, a sapphire substrate, and a quartz substrate.

According to one embodiment of the present invention, a manufacturing method of a group of whiskers can be obtained in which a group of whiskers that does not include a nucleus (a seed atom) can be grown directly on a substrate provided with no seed atom layer.

BRIEF DESCRIPTION OF THE DRAWINGS

In the accompanying drawings:

FIGS. 4A to 4C are each a STEM image showing a cross section of a single whisker;

DETAILED DESCRIPTION OF THE INVENTION

Figure 1A:
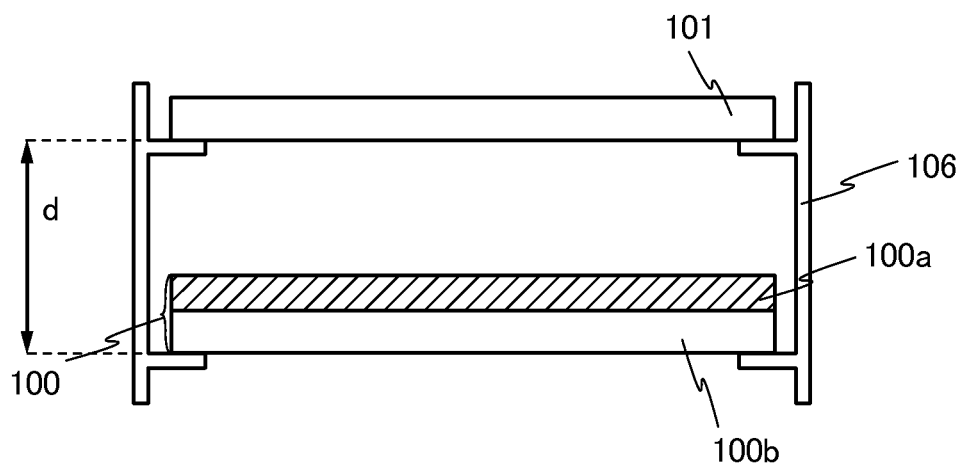
FIGS. 1A and 1B are schematic cross-sectional views illustrating an example of a group of whiskers.

Hereinafter, embodiments of the present invention will be described in detail with reference to the accompanying drawings. Note that the present invention is not limited to the following description, and it is easily understood by those skilled in the art that modes and details can be modified in various ways. Therefore, the present invention is not construed as being limited to description of the embodiments described below.

Note that the term a "single whisker" in this specification and the like means a whisker included in a group of whiskers. Further, the term a "group of whiskers" includes an aggregation of single whiskers, an aggregation of single whiskers each of which grows from a root of another single whisker and part or the whole thereof is combined with the another single whisker, an aggregation of whiskers into which a single whisker has branched and then grown, and the like.

Note that in this specification and the like, the term "over" or "below" does not necessarily mean that a component is placed "directly on" or "directly under" another component. Moreover, the terms "over" and "below" are simply used for convenience of explanation.

Note that the position, the thickness, the size, or the like of each structure illustrated in drawings and the like is not accurately represented in some cases for simplification. Therefore, one embodiment of the disclosed invention is not necessarily limited to the position, the thickness, the size, or the like as disclosed in the drawings and the like.

In this specification and the like, ordinal numbers such as "first", "second", and "third" are used in order to avoid confusion among components, and the terms do not mean limitation of the number of components.

Embodiment 1

In this embodiment, a manufacturing method of a group of whiskers according to one embodiment of the disclosed invention is described. Note that in the manufacturing method of a group of whiskers described in this embodiment, a group of silicon whiskers that does not include a seed atom can be grown directly on a substrate provided with no seed atom layer.

Figure 1B:
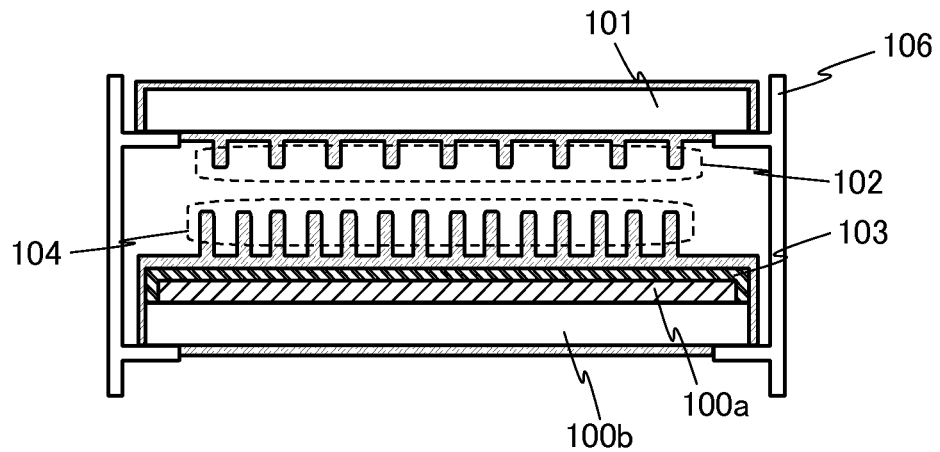
Figure 2:
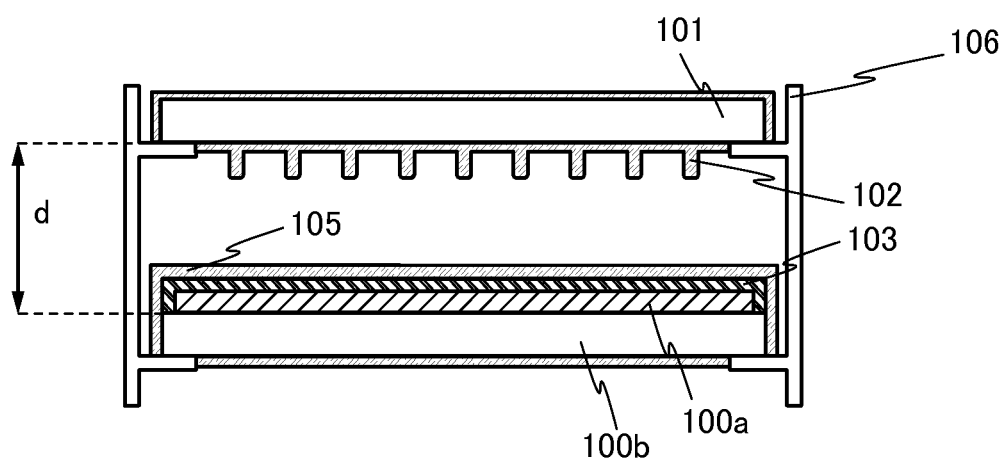
FIG. 2 is a schematic cross-sectional view illustrating an example of a group of whiskers.

FIGS. 1A and 1B and FIG. 2 are cross-sectional views schematically illustrating examples in which a group of whiskers is grown on a formation substrate. A manufacturing method of a group of whiskers is described below with reference to FIGS. 1A and 1B and FIG. 2.

As in FIG. 1A, a seed substrate 100 and a formation substrate 101 are placed in a susceptor 106. The seed substrate 100 includes a seed atom layer 100a and a substrate 100b. Note that the seed substrate 100 and the formation substrate 101 are placed so that a surface of the seed atom layer 100a of the seed substrate 100 is parallel to one surface of the formation substrate 101.

The seed atom layer 100a is formed on the substrate 100b by a printing method, a coating method, an ink-jet method, a CVD method, a sputtering method, an evaporation method, or the like, as appropriate.

There is no particular limitation on a material used for the seed atom layer 100a, as long as the material can directly (or indirectly) promote growth of a group of whiskers. For example, a metal atom typified by titanium, nickel, tungsten, cobalt, iron, chromium, and the like may be used, or an atom other than the metal atom may be used. In this embodiment, titanium is used for the seed atom layer 100a.

As a material used for the substrate 100b, an aluminosilicate glass, a barium borosilicate glass, an aluminoborosilicate glass, sapphire, quartz, or the like can be used. Alternatively, a substrate in which an insulating film is formed over a metal substrate such as a stainless steel substrate may be used. In this embodiment, a glass substrate is used as the substrate 100b.

Next, the substrates are put in a furnace, a gas containing silicon is introduced, and a reduced pressure chemical vapor deposition is performed. The deposition conditions in this embodiment are as follows: the flow rate of a $SiH_4$ gas (a source gas) is 300 sccm; the flow rate of an $N_2$ gas is 300 sccm; the temperature in the furnace is 600° C.; the pressure in the furnace is 20 Pa; the treatment time is 135 minutes; and the distance d between a bottom surface of the substrate 100b and a bottom surface of the formation substrate 101 (the pitch distance of the susceptor 106, hereinafter referred to as the distance between substrates) is 25.4 mm. Note that a He gas with a flow rate of 200 sccm is made flow when the temperature is increased or decreased.

The source gas may be a deposition gas containing at least silicon, and is not limited to a $SiH_4$ gas. Examples of the deposition gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that hydrogen may be introduced into the source gas.

Further, as an inert gas introduced with the source gas, an $N_2$ gas, an Ar gas, a He gas, and the like are given. However, the inert gas is not necessarily introduced. In this embodiment, an $N_2$ gas is introduced.

As the result of the introduction of a gas containing silicon and a reduced pressure chemical vapor deposition, a group of whiskers 102 is formed on the formation substrate 101, as illustrated in FIG. 1B.

There is no particular limitation on a kind of a material used for the formation substrate 101 as long as the material can withstand the temperature at which the reduced pressure chemical vapor deposition is performed. An insulating substrate typified by a quartz substrate, an aluminum oxide substrate, or the like, a silicon wafer, or the like can be used. Note that a substrate having an insulating surface or a substrate the whole of which is formed of an insulating material is referred to as an insulating substrate. In this embodiment, a quartz substrate is used as the formation substrate 101.

Although there is no particular upper limit of the thickness of the seed atom layer 100a, the thickness is preferably at least less than or equal to 0.5 μm. In view of productivity, the thickness is preferably less than or equal to 0.1 μm, further preferably about 10 nm to 50 nm. The thickness of the seed atom layer 100a has effect on formation of the group of whiskers 102 on the formation substrate 101. Note that when the thickness of the seed atom layer 100a is about 10 nm to 50 nm, it is easier to form the group of whiskers 102 on the formation substrate 101.

The degree of deposition of silicon atoms on the seed substrate 100, that is, easiness of forming a group of silicon whiskers, has flexibility. As illustrated in FIG. 1B, a group of whiskers 104 can be formed on the seed substrate 100. Alternatively, as illustrated in FIG. 2, a polysilicon layer 105 can be formed over the seed substrate 100 without forming a group of whiskers. Therefore, the thickness of the seed atom layer 100a has considerable effect on formation of the group of whiskers on the seed substrate 100. As the thickness of the seed atom layer 100a is smaller, the group of whiskers is more likely to be formed on the seed substrate 100 and the formation state of the group of whiskers becomes closer to the state of FIG. 1B. On the other hand, as the thickness of the seed atom layer 100a is larger, the group of whiskers is less likely to be formed on the seed substrate 100, and the formation state of the group of whiskers becomes closer to the state of FIG. 2.

Further, in FIG. 1B, when the group of whiskers 102 is compared with the group of whiskers 104 formed on the seed substrate 100, there are many differences in the density of a group of whiskers, the number of single whiskers, the shape and the size of a single whisker, and the like though the group of whiskers 102 and the group of whiskers 104 are formed on the substrates in the same reduced pressure chemical vapor deposition step. The density of the group of whiskers 102 is low, single whiskers of the group of whiskers 102 are sparsely formed, and a single whisker of the group of whiskers 102 tends to have a shape with a rounded corner. The density of the group of whiskers 104 is high, the length of a single whisker of the group of whiskers 104 is longer than the length of a single whisker of the group of whiskers 102, and single whiskers of the group of whiskers 104 are formed densely and tend to have various shapes.

Note that the seed substrate 100 according to this embodiment may be constituted only by the seed atom layer 100a. There is no particular limitation on the seed substrate 100, as long as it can directly (or indirectly) promote growth of the group of whiskers. Accordingly, a metal plate such as a titanium sheet may be used, for example. Note that it is appropriate that the thickness of the titanium sheet is about 0.1 mm to 0.6 mm.

The shape of a single whisker of the group of whiskers 102 and the shape of a single whisker of the group of whiskers 104 may be a columnar shape such as a cylinder shape or a prism shape, a cone shape, or a pyramid shape. Alternatively, the shape of a single whisker of the group of whiskers 102 and the shape of a single whisker of the group of whiskers 104 may be a needle shape with a sharp end, a shape with a curved end, a shape with round corners, or a taper shape in which either or both side surfaces are inclined.

Note that the shapes and sizes of a single whisker of the group of whiskers 102 and a single whisker of the group of whiskers 104 change depending on the melting point and the boiling point of the seed atom layer 100a; thus, a material of the seed atom layer 100a is preferably selected in accordance with the purpose of use.

A reduced pressure chemical vapor deposition method is preferably employed for a step for growing a group of whiskers. Note that a thermal chemical vapor deposition method is classified into two types according to pressure in deposition: a reduced pressure chemical vapor deposition method in which deposition is performed under pressure lower than atmospheric pressure; and a normal atmospheric pressure chemical vapor deposition method in which deposition is performed under atmospheric pressure.

A group of whiskers which is more uniform and preferable can be formed by the introduction of a gas containing silicon and the reduced pressure chemical vapor deposition. In the deposition step under pressure lower than atmospheric pressure, the mean free path of atoms of a source material in a vapor phase is long; thus, the atoms of the source material sufficiently diffuse even in a step portion, and the atoms can reach a narrow space. Therefore, favorable step coverage can be obtained. Further, in the deposition step under pressure lower than atmospheric pressure, the diffusion coefficient of the atoms of the source material becomes high, and the deposition rate depends on reaction of atoms at a surface rather than transfer of atoms at the surface. Therefore, a rate-determining region can be shifted to a higher temperature side.

Note that in the case where a metal atom which reacts with silicon to form silicide is used for the seed atom layer 100a as in this embodiment, silicide is formed at an interface between the seed atom layer 100a and silicon. A silicide 103 is formed at an interface between a root portion of the group of whiskers 104 and the seed atom layer 100a in FIG. 1B, or at an interface between the polysilicon layer 105 and the seed atom layer 100a in FIG. 2.

For example, in the case where a metal atom typified by titanium, nickel, tungsten, cobalt, iron, chromium, or the like is used as a material for the seed atom layer 100a, titanium silicide, nickel silicide, tungsten silicide, cobalt silicide, iron silicide, chromium silicide, or the like is formed at an interface between the seed atom layer 100a and silicon.

Note that an interface between the seed atom layer 100a and the silicide 103 and an interface between the silicide 103 and silicon, which are formed after the reduced pressure chemical vapor deposition, are not clear.

According to the above-described manufacturing method of a group of whiskers, at least the group of whiskers 102 can be formed on the formation substrate 101 which is placed to face the seed substrate 100. Further, a material for the formation substrate 101 is not limited and can be freely selected as long as the material can withstand the temperature at which the reduced pressure chemical vapor deposition is performed, and the group of whiskers 102 can be grown on the formation substrate 101. Furthermore, since the formation substrate 101 is placed to face the seed substrate 100, the group of whiskers 102 can be grown directly on and in contact with the formation substrate 101 provided with no seed atom layer.

Figure 3A:
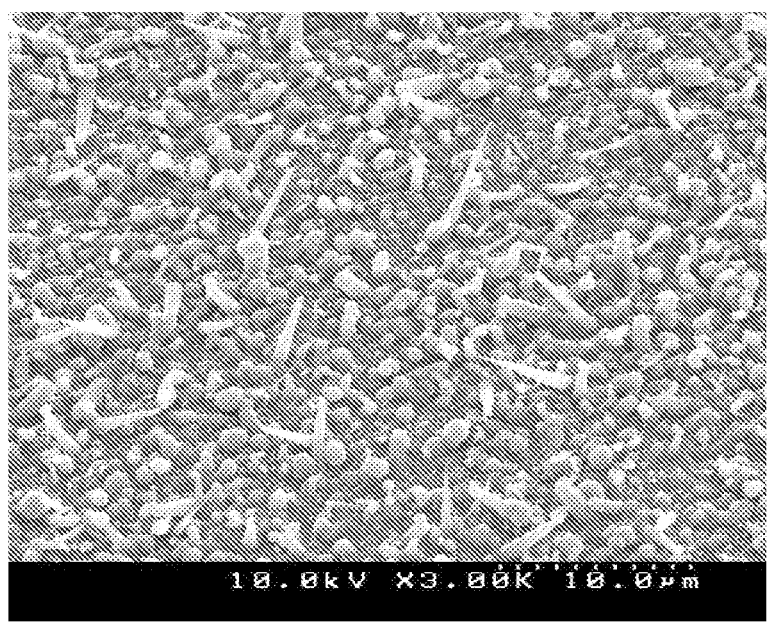
FIGS. 3A and 3B are each a SEM image showing a top surface of a group of whiskers.
Figure 3B:
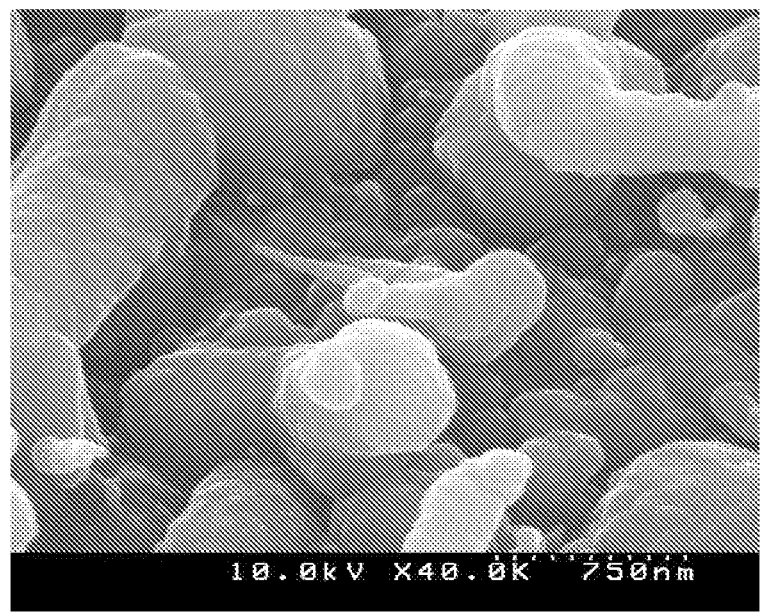
Figure 5A:
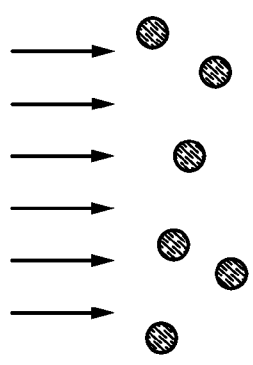
FIGS. 5A to 5D are diagrams illustrating a whisker growth mechanism.
Figure 5B:
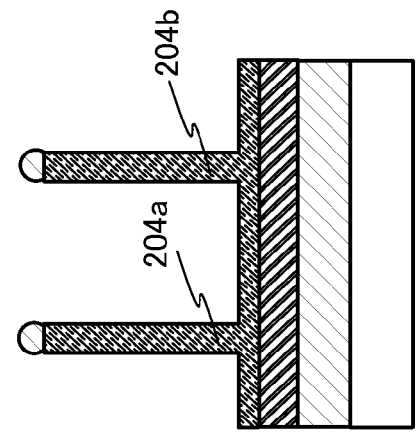
Figure 5C:
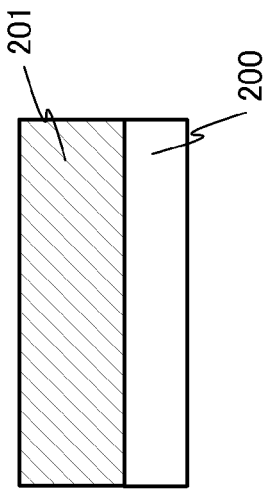
Figure 5D:
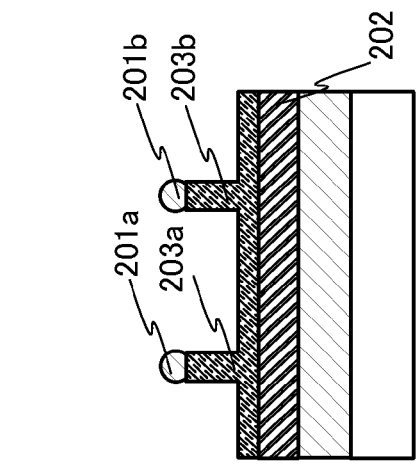

Next, FIGS. 3A and 3B and FIGS. 4A to 4C show a group of whiskers and a single whisker thereof formed on the formation substrate by employing the above-described manufacturing method of a group of whiskers. FIGS. 3A and 3B are observation photographs taken with a scanning electron microscope (SEM), and FIGS. 4A to 4C are observation photographs taken with a scanning transmission electron microscope (STEM).

A quartz substrate is used as the formation substrate 101, titanium is used for the seed atom layer 100a, and a glass substrate is used as the substrate 100b. The thickness of titanium is 500 nm.

FIGS. 3A and 3B are SEM observation photographs showing an enlarged top surface of the group of whiskers. In a SEM observation method, a beam of electrons scans a top surface of a sample while being focused narrowly using an electric field lens so that secondary electrons and reflection electrons generated at the top surface are detected and a microscope image of the top surface of the sample is obtained.

FIGS. 3A and 3B are each an enlarged microscope observation photograph of a top surface of a group of whiskers formed on a quartz substrate. FIG. 3A is taken at 3000-fold magnification with an acceleration voltage of 10.0 kV, and FIG. 3B is taken at 40000-fold magnification with an acceleration voltage of 10.0 kV.

FIGS. 4A to 4C are STEM photographs showing an enlarged cross section of a group of whiskers and an enlarged sample of a single whisker. In a STEM observation method, a microscope photograph is obtained by scanning with a beam of electrons as in a scanning electron microscope (SEM) and utilizing a beam of electrons transmitted through a sample as in a transmission electron microscope (TEM).

FIG. 4A is an enlarged microscope observation photograph of a cross section of a group of whiskers formed on a quartz substrate, which is taken at 19500-fold magnification with an acceleration voltage of 200 kV. FIGS. 4B and 4C are each an enlarged observation photograph of a sample of a single whisker that is cut from the group of whiskers shown in FIG. 4A by rubbing a top surface of the group of whiskers with mesh made of copper, which are taken at 150000-fold magnification with an acceleration voltage of 200 kV.

It is found that a single whisker shown in FIG. 4B has a needle shape with a sharp end and a taper shape in which both side surfaces are inclined. Further, it is found that a single whisker shown in FIG. 4C has a shape with a curved end and a shape close to a cylinder shape. Thus, it is found that there are differences in size and shape even between single whiskers of the same group of whiskers, which are formed by introduction of a gas containing silicon and performing the same reduced pressure chemical vapor deposition step on the substrates.

According to FIGS. 3A and 3B and FIGS. 4A to 4C, sizes of single whiskers are different in width, diameter, and length. In general, a single whisker has a size with a width of about 50 nm to 300 nm, a diameter of about 100 nm to 400 nm, and a length of about 700 nm to 800 nm.

The size of a single whisker depends on the temperature in a furnace in the reduced pressure chemical vapor deposition step. This is because the orientation of silicon crystal grains during the growth of a group of whiskers largely depends on the temperature during the growth of a group of whiskers. Thus, when the temperature in a furnace is relatively low, a group of whiskers does not grow so much, and the higher temperature in a furnace becomes, the easier the group of whiskers grow and thus the longer the length of a single whisker tends to be.

Further, the density of a group of whiskers depends on the distance between substrates. In other words, in the reduced pressure chemical vapor deposition step, when the frequency of collision of an atom under thermal motion in a vapor phase with another atom between the seed substrate and the formation substrate is decreased, the probability of growth of a group of whiskers is increased. In the ideal case, the density of a group of whiskers is the highest when the distance between substrates is set to a distance corresponding to the mean free path of atoms under the pressure of the reduced pressure chemical vapor deposition. In that case, atoms can move straight between the seed substrate and the formation substrate. Therefore, as the distance between substrates is longer, the frequency of collision of an atom under thermal motion in a vapor phase with another atom is increased, and thus the probability of growth of a group of whiskers is decreased and the density of the group of whiskers tends to be decreased.

As described above, the size of a single whisker and the density of a group of whiskers change depending on the distance between substrates and the temperature in a furnace (the temperature of the seed substrate and the temperature of the formation substrate) during the reduced pressure chemical vapor deposition. In order to form a desired group of whiskers in accordance with an application, various conditions need to be adjusted as appropriate.

Note that the densities, the shapes, and the sizes of a group of whiskers and a single whisker is changed depending on a variety of conditions such as the distance between substrates, the temperature in a furnace, the pressure in a furnace, and the treatment time; therefore, the densities, the shapes, and the sizes are not particularly limited.

A constituent (a constituent atom) of a group of whiskers formed on the formation substrate by employing the above-described manufacturing method of a group of whiskers is described. According to the STEM observation results shown in FIGS. 4A to 4C, a seed atom is not seen in a root portion and ends of a group of silicon whiskers. That is, the group of whiskers does not include a seed atom and is constituted only by silicon atoms.

A growth mechanism of a general group of whiskers is described with reference to schematic cross-sectional views shown in FIGS. 5A to 5D. First, a seed atom layer 201 is formed on a substrate 200 (see FIG. 5A). Next, a gas containing silicon is introduced and reduced pressure chemical vapor deposition is performed (see FIG. 5B). A single whisker 203a and a single whisker 203b start to grow from a seed atom 201a and a seed atom 201b which are formed on the substrate 200 so as to follow the seed atom 201a and the seed atom 201b. The seed atom 201a and the seed atom 201b are adhered to ends of the single whisker 203a and the single whisker 203b, respectively, and promote the growth of the single whisker 203a and the single whisker 203b by pulling silicon atoms. Further, a silicide 202 is formed in a root portion of the single whisker 203a and the single whisker 203b (see FIG. 5C). Then, the growth of the single whisker 203a and the single whisker 203b is stopped, and a single whisker 204a having an end to which the seed atom 201a is adhered and a single whisker 204b having an end to which the seed atom 201b is adhered are completed (see FIG. 5D).

A growth mechanism of a group of whiskers formed on the formation substrate by employing the above-described manufacturing method of a group of whiskers differs from the growth mechanism of a general group of whiskers illustrated in FIGS. 5A to 5D.

Therefore, the group of whiskers 102 and the group of whiskers 104 formed on the substrates in the same reduced pressure chemical vapor deposition step differs greatly from a general group of whiskers in a growth mechanism, in addition to the density of a group of whiskers, the number of single whiskers, the shape and the size of a single whisker, and the like.

Considering the above-described growth mechanism, it is extremely difficult to grow a group of whiskers that does not include a seed atom, against the general mechanism in that the seed atom 201a and the seed atom 201b are left on ends of the single whisker 204a and the single whisker 204b, respectively, and the silicide 202 is formed in a root portion of the single whisker 204a and the single whisker 204b.

However, according to the above-described manufacturing method of a group of whiskers, a group of whiskers that does not include a nucleus (a seed atom) can be grown directly on a substrate provided with no seed atom layer, against the general mechanism. When the area of a surface where a polysilicon layer is formed is compared with that of a surface where a group of whiskers is formed by the above-described manufacturing method, the surface area of the latter is significantly larger. Thus, with characteristics of such a surface, a group of whiskers can be used for various applications. For example, the group of whiskers is applied to a solar cell, the power generation efficiency per unit area can be increased and the energy cost can be reduced. Besides, the substrate on which the group of whiskers is formed can be applied to a lithium ion secondary battery, an electrode material, a filter, or the like, and thus can be used for a wide variety of applications.

Embodiment 2

In this embodiment, another manufacturing method of a group of whiskers according to one embodiment of the disclosed invention is described. Note that in the manufacturing method of a group of whiskers described in this embodiment, a group of silicon whiskers that does not include a seed atom can be grown directly on a substrate provided with no seed atom layer.

Figure 6A:
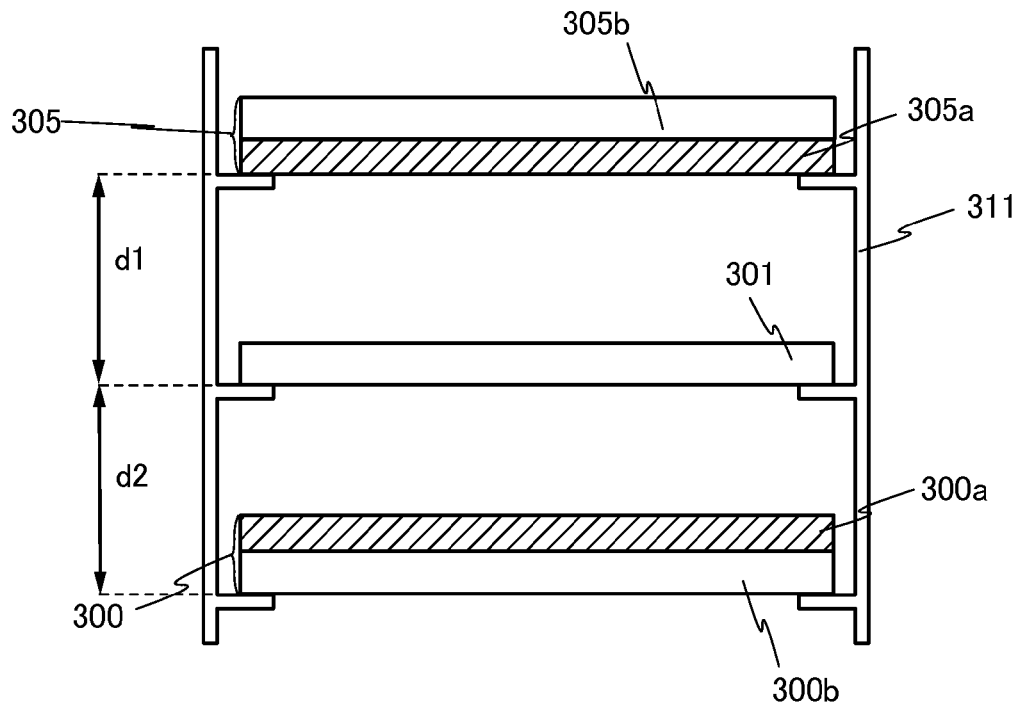
FIGS. 6A and 6B are schematic cross-sectional views illustrating an example of a group of whiskers.
Figure 6B:
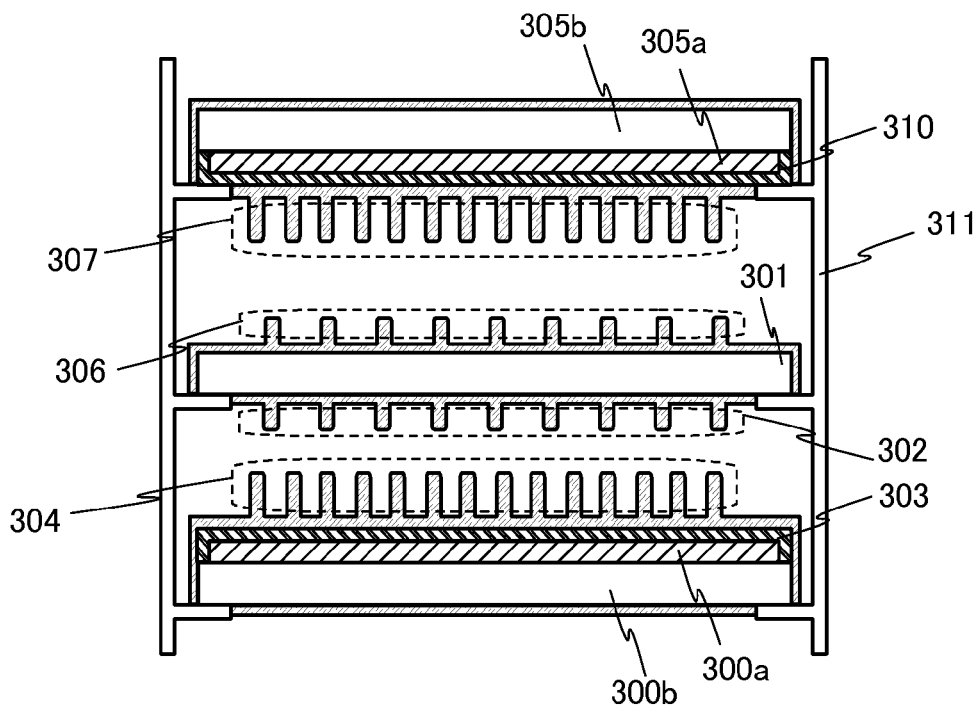
Figure 7:
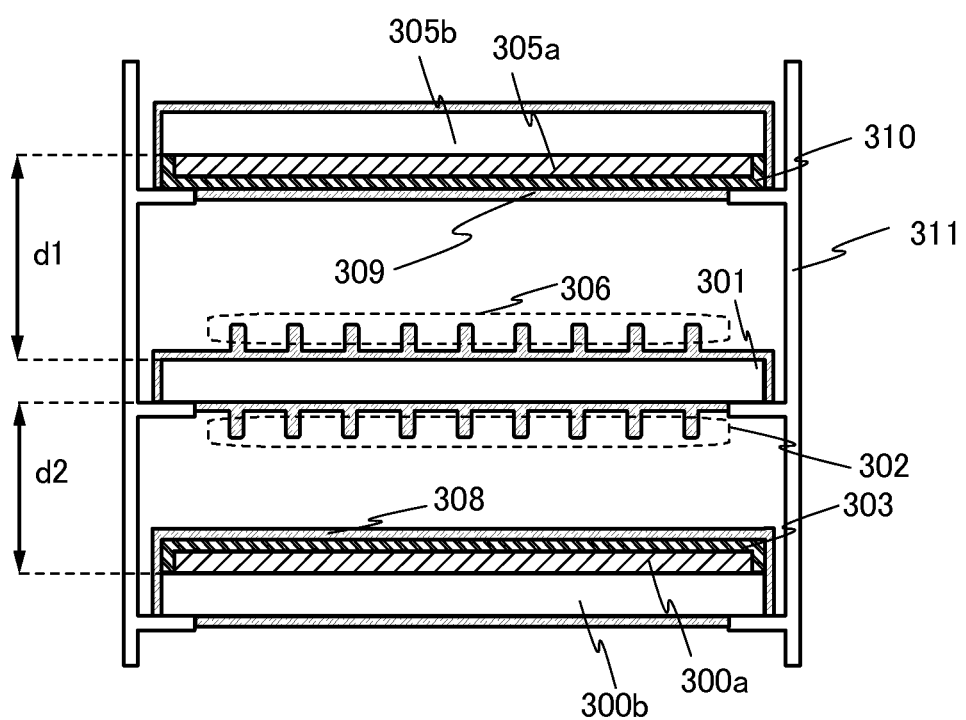
FIG. 7 is a schematic cross-sectional view illustrating an example of a group of whiskers.

FIGS. 6A and 6B and FIG. 7 are cross-sectional views schematically illustrating examples in which a group of whiskers is grown on a formation substrate. A manufacturing method of a group of whiskers is described below with reference to FIGS. 6A and 6B and FIG. 7.

As in FIG. 6A, a first seed substrate 300, a second seed substrate 305, and a formation substrate 301 are placed in a susceptor 311. The first seed substrate 300 includes a seed atom layer 300a and a substrate 300b. The second seed substrate 305 includes a seed atom layer 305a and a substrate 305b.

The first seed substrate 300, the second seed substrate 305, and the formation substrate 301 are placed so that a surface of the seed atom layer 300a of the first seed substrate 300 is parallel to one surface of the formation substrate 301 and a surface of the seed atom layer 305a of the second seed substrate 305 is parallel to the other surface of the formation substrate 301.

Note that the thickness of the seed atom layer 300a, the thickness of the seed atom layer 305a, the distance d1 between a bottom surface of the substrate 305b and a bottom surface of the formation substrate 301, the distance d2 between a bottom surface of the substrate 300b and a bottom surface of the formation substrate 301, and the like illustrated in FIGS. 6A and 6B and FIG. 7 do not accurately show the actual position, thickness, size, and the like. Therefore, embodiments of the present invention are not necessarily limited to the position, thickness, size, and the like illustrated in drawings.

The distance d1 between the bottom surface of the substrate 305b and the bottom surface of the formation substrate 301, and the distance d2 between the bottom surface of the substrate 300b and the bottom surface of the formation substrate 301 are each the pitch distance of the susceptor 311. The distance d1 and the distance d2 are equal to each other.

The seed atom layer 300a and the seed atom layer 305a are formed on the substrate 300b and the substrate 305b, respectively, by a printing method, a coating method, an ink-jet method, a CVD method, a sputtering method, an evaporation method, or the like, as appropriate.

There is no particular limitation on materials used for the seed atom layer 300a and the seed atom layer 305a, as long as the materials can directly (or indirectly) promote growth of a group of whiskers. For example, a metal atom typified by titanium, nickel, tungsten, cobalt, iron, chromium, and the like may be used, or an atom other than the metal atom may be used.

As materials used for the substrate 300b and the substrate 305b, an aluminosilicate glass, a barium borosilicate glass, an aluminoborosilicate glass, sapphire, quartz, or the like can be used. Alternatively, a substrate in which an insulating film is formed over a metal substrate such as a stainless steel substrate may be used.

Next, the substrates are put in a furnace, a gas containing silicon is introduced, and a reduced pressure chemical vapor deposition is performed. The deposition conditions in this embodiment are as follows: the flow rate of a $SiH_4$ gas (a source gas) is 300 sccm; the flow rate of an $N_2$ gas is 300 sccm; the temperature in the furnace is 600° C.; the pressure in the furnace is 20 Pa; the treatment time is 135 minutes; and the distance d1 between the bottom surface of the substrate 305b and the bottom surface of the formation substrate 301 and the distance d2 between the bottom surface of the substrate 300b and the bottom surface of the formation substrate 301 are equally 12.7 mm. Note that a He gas with a flow rate of 200 sccm is made flow when the temperature is increased or decreased.

The source gas may be a deposition gas containing at least silicon, and is not limited to a $SiH_4$ gas. Examples of the deposition gas containing silicon include silicon hydride, silicon fluoride, and silicon chloride; typically, $SiH_4$, $Si_2H_6$, $SiF_4$, $SiCl_4$, $Si_2Cl_6$, and the like are given. Note that hydrogen may be introduced into the source gas.

Further, as an inert gas introduced with the source gas, an $N_2$ gas, an Ar gas, a He gas, and the like are given. However, the inert gas is not necessarily introduced. In this embodiment, an $N_2$ gas is introduced.

As the result of the introduction of a gas containing silicon and the reduced pressure chemical vapor deposition, a group of whiskers 302 and a group of whiskers 306 are formed on the formation substrate 301, as illustrated in FIG. 6B.

There is no particular limitation on a kind of a material used for the formation substrate 301 as long as the material can withstand the temperature at which the reduced pressure chemical vapor deposition is performed. An insulating substrate typified by a quartz substrate, an aluminum oxide substrate, or the like, a silicon wafer, or the like can be used. Note that a substrate having an insulating surface or a substrate the whole of which is formed of an insulating material is referred to as an insulating substrate.

Although there is no particular upper limit of the thicknesses of the seed atom layer 300a and the seed atom layer 305a, the thickness is preferably at least less than or equal to 0.5 μm. In view of productivity, the thicknesses is preferably less than or equal to 0.1 μm, further preferably about 10 nm to 50 nm. The thicknesses of the seed atom layer 300a and the seed atom layer 305a have effect on formation of the group of whiskers 302 and the group of whiskers 306 formed on the formation substrate 301. Note that when the thicknesses of the seed atom layer 300a and the seed atom layer 305a are each about 10 nm to 50 nm, it is easier to form the group of whiskers 302 and the group of whiskers 306 on the formation substrate 301.

The degree of deposition of silicon atoms on the first seed substrate 300 and the second seed substrate 305, that is, easiness of forming a group of silicon whiskers, has flexibility. As illustrated in FIG. 6B, a group of whiskers 304 and a group of whiskers 307 can be formed on the first seed substrate 300 and the second seed substrate 305. Alternatively, as illustrated in FIG. 7, a polysilicon layer 308 and a polysilicon layer 309 can be formed on the first seed substrate 300 and the second seed substrate 305, respectively, without forming a group of whiskers. Therefore, the thicknesses of the seed atom layer 300a and the seed atom layer 305a have considerable effect on formation of the groups of whiskers formed on the first seed substrate 300 and the second seed substrate 305. As the thicknesses of the seed atom layer 300a and the seed atom layer 305a are smaller, the groups of whiskers is more likely to be formed on the seed substrate 300 and the second seed substrate 305 and the formation state of the group of whiskers becomes closer to the state of FIG. 6B. On the other hand, as the thicknesses of the seed atom layer 300a and the seed atom layer 305a are larger, the groups of whiskers is less likely to be formed on the first seed substrate 300 and the second seed substrate 305, and the formation state of the group of whiskers becomes closer to the state of FIG. 7.

Further, in FIG. 6B, when the group of whiskers 304 formed on the first seed substrate 300 and the group of whiskers 307 formed on the second seed substrate 305 are compared with the group of whiskers 302 and 306 formed on the seed substrate 301, there are many differences in the density of a group of whiskers, the number of single whiskers, the shape and the size of a single whisker, and the like though the groups of whiskers are formed on the substrates in the same reduced pressure chemical vapor deposition step. The density of the group of whiskers 302 and the density of the group of whiskers 306 are each low, single whiskers of the group of whiskers 302 are sparsely formed and single whiskers of the group of whiskers 306 are also sparsely formed, and a single whisker of the group of whiskers 302 and a single whisker of the group of whiskers 306 each tend to have a shape with a rounded corner. The density of the group of whiskers 304 and the density of the group of whiskers 307 are each high, the length of a single whisker of the group of whiskers 304 and the length of a single whisker of the group of whiskers 307 are longer than that of a single whisker of the group of whiskers 302 and that of a single whisker of the group of whiskers 306, and single whiskers of the group of whiskers 304 and single whiskers of the group of whiskers 307 are formed densely and tend to have various shapes.

Note that the first seed substrate 300 according to this embodiment may be constituted only by the seed atom layer 300a and the second seed substrate 305 according to this embodiment may be constituted only by the seed atom layer 305a. There are no particular limitations on the seed substrates, as long as they can directly (or indirectly) promote growth of the group of whiskers. Accordingly, a metal plate such as a titanium sheet may be used, for example. Note that it is appropriate that the thickness of the titanium sheet is about 0.1 mm to 0.6 mm.

The shape of a single whisker of the group of whiskers 302, the shape of a single whisker of the group of whiskers 304, the shape of a single whisker of the group of whiskers 306, and the shape of a single whisker of the group of whiskers 307 may be a columnar shape such as a cylinder shape or a prism shape, a cone shape, or a pyramid shape. Alternatively, the shapes thereof may be a needle shape with a sharp end, a shape with a curved end, a shape with round corners, or a taper shape in which either or both side surfaces are inclined.

Note that the shapes and sizes of a single whisker of the group of whiskers 302, a single whisker of the group of whiskers 304, a single whisker of the group of whiskers 306, and a single whisker of the group of whiskers 307 change depending on the melting points and the boiling points of the seed atom layers 300a and 305a; thus, materials of the seed atom layers 300a and 305a are preferably selected in accordance with the purpose of use.

Note that a reduced pressure chemical vapor deposition method is preferably employed for a step for growing a group of whiskers.

A group of whiskers which is more uniform and preferable can be formed by the introduction of a gas containing silicon and the reduced pressure chemical vapor deposition. In the deposition step under pressure lower than atmospheric pressure, the mean free path of atoms of a source material in a vapor phase is long; thus, the atoms of the source material sufficiently diffuse even in a step portion, and the atoms can reach a narrow space. Therefore, favorable step coverage can be obtained. Further, in the deposition step under pressure lower than atmospheric pressure, the diffusion coefficient of the atoms of the source material becomes high, and the deposition rate depends on reaction of atoms at a surface rather than transfer of atoms at the surface. Therefore, a rate-determining region can be shifted to a higher temperature side.

Note that in the case where a metal atom which reacts with silicon to form silicide is used for the seed atom layer 300a and the seed atom layer 305a, silicide is formed at an interface between the seed atom layer 300a and silicon and at an interface between the seed atom layer 305a and silicon. In FIG. 6B, a silicide 303 is formed at an interface between a root portion of the group of whiskers 304 and the seed atom layer 300a, and a silicide 310 is formed at an interface between a root portion of the group of whiskers 307 and the seed atom layer 305a. In FIG. 7, the silicide 303 is formed at an interface between the polysilicon layer 308 and the seed atom layer 300a and the silicide 310 is formed at an interface between the polysilicon layer 309 and the seed atom layer 305a.

For example, in the case where a metal atom typified by titanium, nickel, tungsten, cobalt, iron, chromium, or the like is used as materials for the seed atom layer 300a and the seed atom layer 305a, titanium silicide, nickel silicide, tungsten silicide, cobalt silicide, iron silicide, chromium silicide, or the like is formed at an interface between the seed atom layer 300a and silicon and at an interface between the seed atom layer 305a and silicon.

Note that an interface between the seed atom layer 300a and the silicide 303, an interface between the silicide 303 and silicon, an interface between the seed atom layer 305a and the silicide 310, and an interface between the silicide 310 and silicon, which are formed after the reduced pressure chemical vapor deposition, are not clear.

According to the above-described manufacturing method of a group of whiskers, the group of whiskers 302 can be formed on one surface of the formation substrate 301 and the group of whiskers 306 can be formed on the other surface of the formation substrate 301. Further, a material for the formation substrate 301 is not limited and can be freely selected as long as the material can withstand the temperature at which the reduced pressure chemical vapor deposition is performed, and the group of whiskers 302 and the group of whiskers 306 can be grown on the formation substrate 301. Furthermore, since the formation substrate 301 is placed between the first seed substrate 300 and the second seed substrate 305, the group of whiskers 302 and the group of whiskers 306 can be grown directly on and in contact with the surfaces of the formation substrate 301 provided with no seed atom layer.

A growth mechanism of a group of whiskers formed on the formation substrate by employing the above-described manufacturing method of a group of whiskers differs from the growth mechanism of a general group of whiskers illustrated in FIGS. 5A to 5D. Therefore, the group of whiskers 302 and the group of whiskers 306 are constituted by only silicon atoms and do not include seed atoms.

Therefore, according to the above-described manufacturing method of a group of whiskers, a group of whiskers that does not include a nucleus (a seed atom) can be grown directly on a substrate provided with no seed atom layer, against the general mechanism in that seed atoms are left on ends of a group of whiskers and a silicide is formed in a root portion of the group of whiskers. When the surface area of a surface where a polysilicon layer is formed is compared with that of a surface where a group of whiskers is formed by the above-described manufacturing method, the surface area of the latter is significantly larger. Thus, with characteristics of such a surface, the group of whiskers can be used for various applications. For example, the group of whiskers is applied to a solar cell, the power generation efficiency per unit area can be increased and the energy cost can be reduced. Besides, the substrate on which the group of whiskers is formed can be applied to a lithium ion secondary battery, an electrode material, a filter, or the like, and thus can be used for a wide variety of applications.

This application is based on Japanese Patent Application serial no. 2010-232927 filed with Japan Patent Office on Oct. 15, 2010, the entire contents of which are hereby incorporated by reference.

What is claimed is:

1. A manufacturing method comprising the steps of:
providing a seed atom layer on a surface of a first substrate;
placing the first substrate and a second substrate so that the surface of the first substrate faces a surface of the second substrate, and
introducing a gas containing silicon and performing chemical vapor deposition so as to grow a group of whiskers from the second substrate,
wherein no seed atom layer is included with the second substrate.

2. The manufacturing method according to claim 1, wherein the group of whiskers is formed from the second substrate in a direction to the first substrate.

3. The manufacturing method according to claim 1, wherein the chemical vapor deposition is reduced pressure chemical vapor deposition.

4. The manufacturing method according to claim 1, wherein the step of
performing the chemical vapor deposition is performed under conditions that temperature is greater than or equal to 600° C. and less than or equal to 700° C., pressure is greater than or equal to 20 Pa and less than or equal to 200 Pa, a flow rate of a $SiH_4$ gas is greater than or equal to 300 sccm and less than or equal to 3000 sccm, and a flow rate of an $N_2$ gas is greater than or equal to 0 seem and less than or equal to 1000 sccm.

5. The manufacturing method according to claim 1, wherein a single whisker of the group of whiskers has a width of 50 nm to 300 nm, a diameter of 100 nm to 400 nm, and a length of less than 800 nm.

6. The manufacturing method according to claim 1, wherein the second substrate is any one of an aluminosilicate glass substrate, a barium borosilicate glass substrate, an aluminoborosilicate glass substrate, a sapphire substrate, and a quartz substrate, wherein a group of silicon whiskers is grown directly on the second substrate.

7. The manufacturing method according to claim 1, wherein a distance between the second substrate and the first substrate is greater than or equal to 1.0 cm and less than or equal to 3.0 cm.

8. The manufacturing method according to claim 1, wherein a thickness of the seed atom layer is greater than or equal to 10 nm and less than or equal to 1000 nm.

9. A manufacturing method, comprising the steps of:
placing a first substrate and a second substrate, the first substrate comprising a seed atom, wherein a surface of the first substrate faces a surface of the second substrate, and
introducing a gas containing silicon and performing chemical vapor deposition so as to grow a group of whiskers from the second substrate,
wherein no seed atom layer is included with the second substrate.

10. The manufacturing method according to claim 9, wherein the group of whiskers is formed from the second substrate in a direction to the first substrate.

11. The manufacturing method according to claim 9, wherein the chemical vapor deposition is reduced pressure chemical vapor deposition.

12. The manufacturing method according to claim 9, wherein the step of performing the chemical vapor deposition is performed under conditions that temperature is greater than or equal to 600° C. and less than or equal to 700° C., pressure is greater than or equal to 20 Pa and less than or equal to 200 Pa, a flow rate of a $SiH_4$ gas is greater than or equal to 300 sccm and less than or equal to 3000 sccm, and a flow rate of an $N_2$ gas is greater than or equal to 0 sccm and less than or equal to 1000 seem.

13. The manufacturing method according to claim 9, wherein a single whisker of the group of whiskers has a width of 50 nm to 300 nm, a diameter of 100 nm to 400 nm, and a length of less than 800 nm.

14. The manufacturing method according to claim 9, wherein a distance between the second substrate and the first substrate is greater than or equal to 1.0 cm and less than or equal to 3.0 cm.

15. A manufacturing method comprising the steps of:
providing a first seed atom layer on a surface of a first substrate;
providing a second seed atom layer on a surface of a third substrate;
placing the first substrate, a second substrate, and the third substrate so that the surface of the first substrate faces one surface of the second substrate, and the surface of the third substrate faces the other surface of the second substrate, and
introducing a gas containing silicon and performing chemical vapor deposition so as to grow a group of whiskers from the second substrate,
wherein no seed atom layer is included with the second substrate.

16. The manufacturing method according to claim 15, wherein the group of whiskers is formed on the one surface and the other surface of the second substrate.

17. The manufacturing method according to claim 15, wherein the chemical vapor deposition is reduced pressure chemical vapor deposition.

18. The manufacturing method according to claim 15, wherein the step of performing the chemical vapor deposition is performed under conditions that temperature is greater than or equal to 600° C. and less than or equal to 700° C., pressure is greater than or equal to 20 Pa and less than or equal to 200 Pa, a flow rate of a $SiH_4$ gas is greater than or equal to 300 sccm and less than or equal to 3000 sccm, and a flow rate of an $N_2$ gas is greater than or equal to 0 sccm and less than or equal to 1000 sccm.

19. The manufacturing method according to claim 15, wherein a single whisker of the group of whiskers has a width of 50 nm to 300 nm, a diameter of 100 nm to 400 nm, and a length of less than 800 nm.

20. The manufacturing method according to claim 15, wherein the second substrate is any one of an aluminosilicate glass substrate, a barium borosilicate glass substrate, an aluminoborosilicate glass substrate, a sapphire substrate, and a quartz substrate, wherein a group of silicon whiskers is grown directly on the first substrate.

21. The manufacturing method according to claim 15, wherein a distance between the second substrate and the first substrate is greater than or equal to 1.0 cm and less than or equal to 3.0 cm.

22. The manufacturing method according to claim 15, wherein a distance between the second substrate and the first substrate and a distance between the second substrate and the third substrate are each greater than or equal to 1.0 cm and less than or equal to 3.0 cm.

23. The manufacturing method according to claim 15, wherein each of a thickness of the first seed atom layer and a thickness of the second seed atom layer is greater than or equal to 10 nm and less than or equal to 1000 nm.

24. A manufacturing method, comprising the steps of:
placing a substrate comprising a first seed atom, a first substrate, and a substrate comprising a second seed atom so that a surface of the substrate comprising the first seed atom faces one surface of the first substrate, and a surface of the substrate comprising the second seed atom faces the other surface of the first substrate, and
introducing a gas containing silicon and performing chemical vapor deposition so as to grow a group of whiskers from the first substrate,
wherein no seed atom layer is included with the first substrate.

25. The manufacturing method according to claim 24, wherein the group of whiskers is formed on the one surface and the other surface of the first substrate.

26. The manufacturing method according to claim 24, wherein a reduced pressure chemical vapor deposition device is used for introducing the gas containing silicon and performing the chemical vapor deposition so as to grow the group of whiskers from the first substrate.

27. The manufacturing method according to claim 24, wherein the step of performing the chemical vapor deposition is performed under conditions that temperature is greater than or equal to 600° C. and less than or equal to 700° C., pressure is greater than or equal to 20 Pa and less than or equal to 200 Pa, a flow rate of a $SiH_4$ gas is greater than or equal to 300 seem and less than or equal to 3000 seem, and a flow rate of an $N_2$ gas is greater than or equal to 0 seem and less than or equal to 1000 seem.

28. The manufacturing method according to claim 24, wherein the chemical vapor deposition is reduced pressure chemical vapor deposition.

29. The manufacturing method according to claim 24, wherein a distance between the first substrate and the substrate comprising the first seed atom is greater than or equal to 1.0 cm and less than or equal to 3.0 cm.

30. The manufacturing method according to claim 24, wherein a distance between the first substrate and the substrate comprising the first seed atom and a distance between the first substrate and the substrate comprising the second seed atom are each greater than or equal to 1.0 cm and less than or equal to 3.0 cm.

* * * * *

UNITED STATES PATENT AND TRADEMARK OFFICE
CERTIFICATE OF CORRECTION

PATENT NO. : 8,658,246 B2  
APPLICATION NO. : 13/248675  
DATED : February 25, 2014  
INVENTOR(S) : Toshihiko Takeuchi et al.

Page 1 of 1

It is certified that error appears in the above-identified patent and that said Letters Patent is hereby corrected as shown below:

In the Claims:

Col. 13, line 50, Claim 4, "seem and less than" should read "sccm and less than"

Col. 14, line 25, Claim 12, "equal to 1000 seem." should read "equal to 1000 sccm."

Col. 16, line 15, Claim 27, "seem and less than or equal to 3000 seem," should read "sccm and less than or equal to 3000 sccm,"

Col. 16, line 16, Claim 27, "equal to 0 seem and" should read "equal to 0 sccm and"

Col. 16, line 17, Claim 27, "equal to 1000 seem." should read "equal to 1000 sccm."

Signed and Sealed this  
Twenty-fourth Day of June, 2014

Michelle K. Lee  
*Deputy Director of the United States Patent and Trademark Office*